US008482904B2

(12) United States Patent
Darroman et al.

(10) Patent No.: US 8,482,904 B2

(45) Date of Patent: Jul. 9, 2013

(54) POWER MODULE WITH CURRENT SENSING

(75) Inventors: Yann Darroman, Barcelona (ES); Antoni Ferre Fabregas, Valls (ES); Jose Gabriel Fernandez Banares, Valls (ES)

(73) Assignee: Lear Corporation, Southfield, MI (US)

( * ) Notice: Subject to any disclaimer, the term of this patent is extended or adjusted under 35 U.S.C. 154(b) by 342 days.

(21) Appl. No.: 12/786,607

(22) Filed: May 25, 2010

(65) Prior Publication Data

US 2011/0292617 A1 Dec. 1, 2011

(51) Int. Cl.
*H02B 1/26* (2006.01)

(52) U.S. Cl.
USPC .......................................................... 361/624

(58) Field of Classification Search
None
See application file for complete search history.

(56) References Cited

U.S. PATENT DOCUMENTS 5,196,987 A * 3/1993 Webber et al. ................ 361/624
5,274,528 A * 12/1993 Noschese et al. ............. 361/642
5,300,917 A 4/1994 Maue et al.
5,351,165 A * 9/1994 Hancock ....................... 361/637
5,375,954 A * 12/1994 Eguchi ........................... 411/48
5,608,595 A * 3/1997 Gourab et al. .................. 361/79
5,764,487 A * 6/1998 Natsume ....................... 361/775
5,831,425 A 11/1998 Ochiai
6,079,920 A * 6/2000 Dispenza ...................... 411/107
6,181,590 B1 * 1/2001 Yamane et al. ............... 363/132
6,327,165 B1 * 12/2001 Yamane et al. ............... 363/132
6,434,008 B1 * 8/2002 Yamada et al. ............... 361/728
6,843,335 B2 * 1/2005 Shirakawa et al. .......... 180/65.1
6,866,527 B2 * 3/2005 Potega .......................... 439/218
6,900,986 B2 * 5/2005 Kimoto et al. ................ 361/704
6,903,457 B2 * 6/2005 Nakajima et al. ............. 257/717
7,046,518 B2 * 5/2006 Golightly et al. ............. 361/736
7,149,088 B2 * 12/2006 Lin et al. ....................... 361/704
7,289,329 B2 * 10/2007 Chen et al. .................... 361/707
7,301,755 B2 * 11/2007 Rodriguez et al. ............ 361/676
7,436,672 B2 * 10/2008 Ushijima et al. .............. 361/715
2002/0034088 A1 * 3/2002 Parkhill et al. ................ 363/144
2005/0051874 A1 * 3/2005 Ushijima ...................... 257/573
2006/0086981 A1 * 4/2006 Yamaguchi et al. .......... 257/347
2006/0092611 A1 * 5/2006 Beihoff et al. ................ 361/698
2006/0202666 A1 * 9/2006 Laig-Hoerstebrock et al. ............................ 320/150
2007/0051974 A1 * 3/2007 Azuma et al. ................. 257/177
2007/0052505 A1 * 3/2007 Simpson ....................... 333/263
2007/0246812 A1 * 10/2007 Zhuang ......................... 257/678
2008/0030208 A1 2/2008 Aratani
2008/0266803 A1 * 10/2008 Golhardt et al. .............. 361/700
2008/0316710 A1 * 12/2008 Seto et al. ..................... 361/704
2009/0002956 A1 * 1/2009 Suwa et al. ................... 361/728
2009/0058334 A1 3/2009 Yamamoto
2009/0294195 A1 * 12/2009 Otsuka et al. ............ 180/65.275
2010/0148298 A1 * 6/2010 Takano et al. ................. 257/500

FOREIGN PATENT DOCUMENTS

CN 2925014 Y 7/2007

* cited by examiner

*Primary Examiner* — Lisa Lea Edmonds
*Assistant Examiner* — Xanthia C Cunningham
(74) *Attorney, Agent, or Firm* — Brooks Kushman P.C.

(57) ABSTRACT

A power module operable to sense current, such as but not limited to a power module operable within a vehicle to sense current while rectifying an AC input to a DC output. The power module may include a shunt disposed relative an output of the power module to facilitate the current measurement.

20 Claims, 7 Drawing Sheets

Electronics
Circuit
130 166 168 154 152 144 132 178 160 134 172 142 162 178 140 150 138 148

POWER MODULE WITH CURRENT SENSING

TECHNICAL FIELD

The present invention relates to power modules having current sensing capabilities, such as but not limited to power modules operable within a vehicle.

BACKGROUND

A power module may be configured to filter, rectify, invert, or otherwise manipulate electrical energy. The components comprising the power module may be selected according to the manipulation provided by the power module and the attendant power demands. Greater power demands are typically required of power modules used to manipulate electrical energy at higher voltage levels due to increased current requirements. This can be problematic, for example, in fully or partially, electrically-driven vehicles, such as but not limited to electric vehicles (EV) and hybrid electric vehicles (HEVs), where a high voltage source may be used to electrically power a motor used to drive the vehicle since the higher voltage can increase current carrying demands and electrical interferences.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION

Figure 1:
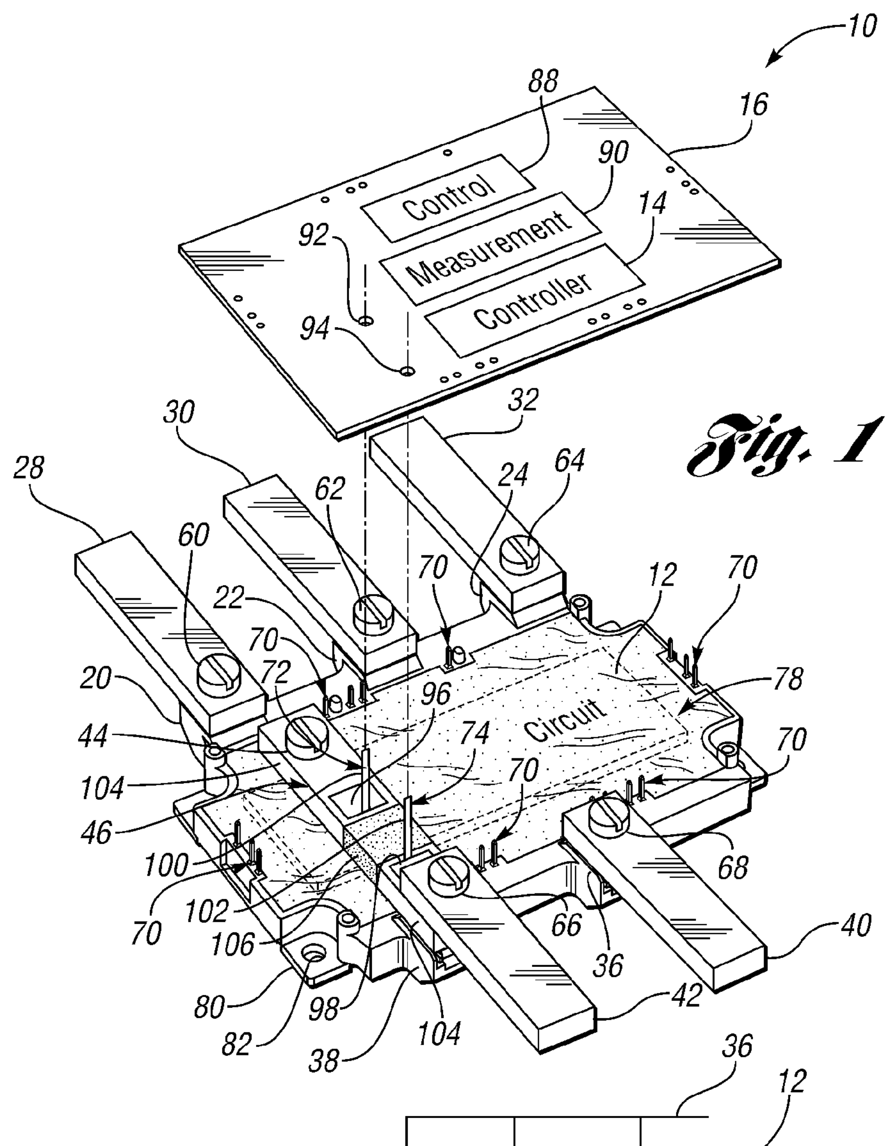
FIG. 1 illustrates a power module configured in accordance with one non-limiting aspect of the present invention.

FIG. 1 illustrates a power module 10 configured in accordance with one non-limiting aspect of the present invention. The power module 10 is described with respect to including a circuit 12 operable to rectify a three-phase, alternating current (AC) input to a direct current (DC) output. The circuit 12 is configured in this manner for exemplary purposes only, as the present invention fully contemplates the power module 10 including any number of other capabilities, and the components attendant thereto, such as but not limited to the components necessary to support filtering, inverting, and converting single and/or multiple-phase AC inputs and DC inputs to single and/or multiple-phase AC outputs and DC outputs.

Figure 2:
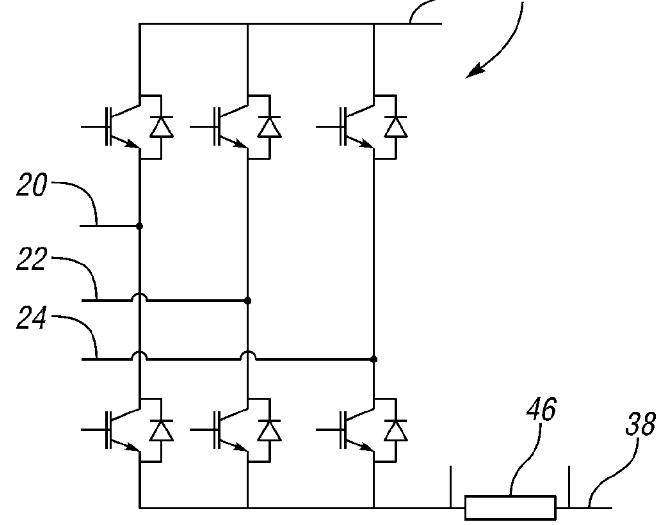
FIG. 2 schematically illustrates a circuit in accordance with one non-limiting aspect of the present invention.

FIG. 2 schematically illustrates the circuit 12 in accordance with one non-limiting aspect of the present invention. The illustrated circuit includes a plurality of switches (shown as six combinations of FETs and diodes). A controller 14 included within a printed circuit board (PCB) 16 is positioned above the circuit 12 and in electrical communication therewith to control switch operations to perform the contemplated rectification. The circuit 12 is electrically connected to the three-phase, AC input by of first, second, and third terminals 20, 22, 24 that correspondingly receive first, second, and third busbars 28, 30, 32 used to transport the AC input, such as from a vehicle alternator or wall outlet. Similarly, first and second terminals 36, 38 on the output receive corresponding first and second busbars 40, 42 used to transport the DC output.

Figure 3:
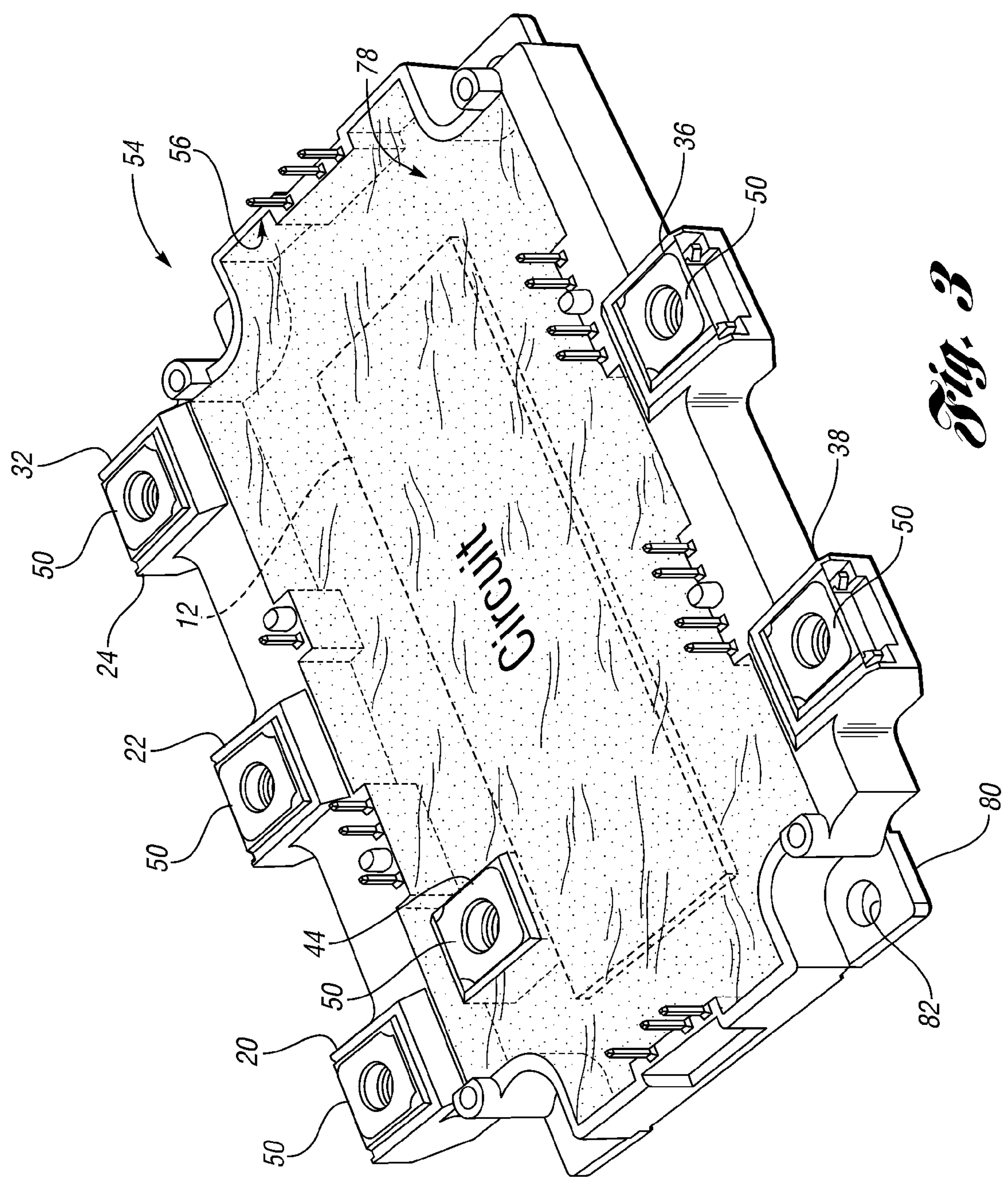
FIG. 3 illustrates a housing in accordance with one non-limiting aspect of the present invention.

A fifth terminal 44, or shunt terminal, is used to support connection of a shunt 46 between one or the output terminals 38 and at least one of the switches. The terminals 20, 22, 24, 36, 38, 44, each may include a conducting insert 50 positioned relative to a fastener opening. FIG. 3 illustrates a housing 54 having the terminals 20, 22, 24, 36, 38, 44 and a recess 56 for supporting the circuit 12 in accordance with one non-limiting aspect of the present invention. The threaded fasteners 60, 62, 64, 66, 68 shown in FIG. 1 may be used to mechanically and electrically fasten the busbars 28, 30, 32, 40, 42 to the terminals 20, 22, 24, 36, 38, 44 and/or some other fasteners or welding operation may be used to provide substantially the same result. The terminals 20, 22, 24, 36, 38, 44 may be connected, such as by way of wiring or traces, to one of a plurality of switches of the circuit, or in the case of the second output terminal 38, to the shunt 46 used to facilitate the measurement of current therethrough. Pins 70 may be included to electrically connect the PCB 16 to the circuit 12 by way of wires and/or other connections extending between the pins 70 and circuit 12. The PCB 16 may be connected to the shunt 46 by pins 72, 74.

A resin or other material 78 may be poured within the recess to be cured over the circuit 12. Optionally, the entire circuit 12 may be covered by the resin 78. The housing 54 is preferably, but not necessarily, comprised of a relative rigid and non-conducting material, such as but not limited to plastic, ceramic or the like, so that the housing 54 can act as an insulator/heat conductor and to provide structural support. A bottom of the housing may include or be connected to a coldplate 80 that extends widthwise and lengthwise thereacross to further facilitate heat dissipation. Optionally, the housing 54 may be a conductor and/or include conducting potions. Apertures 82, with threaded or non-threaded channels, may be included on a perimeter, and if necessary elsewhere, to facilitate mechanically connecting the housing 54 to a vehicle, such as with the use of a corresponding fastener.

The placement of the shunt 46 can be seen to be generally above the circuit 12 on a plane shared by the first, second, and third input terminals 20, 22, 24 and the first and second output terminal 36, 38. The second busbar 42 may be positioned above the shunt 46 and above the shared plane so that the shunt 46 and second busbar 42 can be fastened to the housing 54 with the same fastener 66. While the second busbar 42 is shown to be above the shared plane, the shunt 46 may be lowered, such as by including a corresponding relief within the housing 54, so that the second busbar 42 connects to the housing 54 at the same shared plane. The busbars 28, 30, 32, 40, 42 may be helpful in supporting the relatively high current demands of a traction motor, a high voltage battery, or other higher current demanding elements. The busbars 28, 30, 32, 40, 42 may be desired over wires or other conductors because they are rigid elements that can be electrically connected to the circuit 12 and shunt 46 with the illustrated fasteners 60, 62, 64, 66, 68, and optionally, without having to weld, solder, or otherwise adhered thereto.

Once the circuit 12 is positioned within the housing 54 and the busbars 28, 30, 32, 40, 42 are a secured to the terminals 20, 22, 24, 36, 38, 44 and the shunt 46 may be disposed above the circuit 12 and shunt 46. The PCB 16 may include control electronics 88 operable to control opening and closing of each of the switches or other elements of the circuit 12 and measurement electronics 90 operable to measure a voltage drop between first and second shunt pins 72, 74 adhered to the shunt 46. The PCB 16 includes first and second electrically conducting apertures 92, 94 above the first and second shunt pins 72, 74 to establish an electrical connection between each of the shunt pins 72, 74 and the measurement electronics 90. The shunt pins 72, 74 may be rigid, L-shape pins having a pad 96, 98 adhered to the shunt 46 and a leg 100, 102 projecting upwardly through the PCB. The shunt pad 96, 98 may be welded or otherwise adhered to the shunt 46 and the shunt leg 100, 102 may be soldered or otherwise adhered to the PCB 16.

The shunt 46 may be comprised of a first material 104, such as but not limited to copper, disposed on opposite first and second sides of a second material 106, such as but not limited to manganin. The second material 106 may be a measurement grade material having relatively known electrically resistivity in order to facilitate measuring the voltage drop therethrough. As shown, the shunt pins 72, 74 are positioned proximate to each boundary between the first 104 and second material 106 without covering the second material 106. The shunt 46 may also be sized and shaped to match the size and shape off the busbars 28, 30, 32, 40, 42, or the cross-sections thereof, such that the shunt 46 may have a cross-section, if not also a length, that matches or is the same as the busbars 28, 30, 32, 40, 42.

In the illustrated configuration, the shunt 46 extends over at least a portion of the circuit 12. An area between a bottom of the shunt 46 and a top of the circuit 12 may be insulated by the resin 78 optionally poured overtop of the circuit 12 and/or with another insulator, such as with a pad or other element adhered to the bottom of the shunt 46. The shunt 46 is positioned between the one of the switches of the circuit 12 and the second busbar 42 such that all current passing through the second busbar 42 must pass through the shunt 46, thereby allowing it to be measured with the measurement electronics 90. The circuit 12 may be controlled with the controller 14 by way of signals carried through one or more connection pins 70 included with the housing 54 to support electrical connect with the PCB 16 and the monitor of other measurement parameters, such as temperature.

Figure 4:
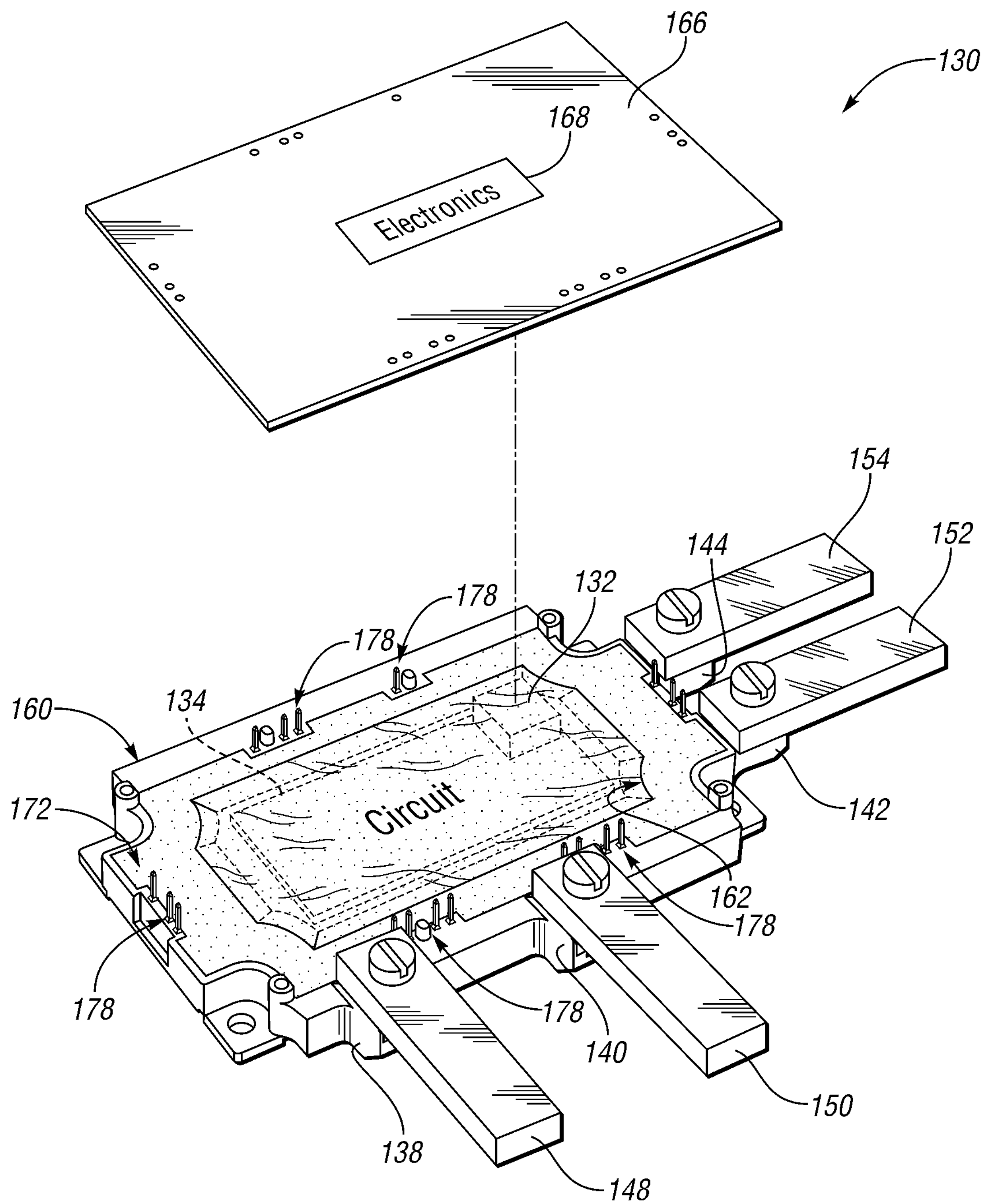
FIG. 4 illustrates a power module in accordance with one non-limiting aspect of the present invention.

FIG. 4 illustrates a power module 130 having a shunt 132 embedded within a circuit 134 in accordance with one non-limiting aspect of the present invention. This module 130 is shown to be configured to support rectifying single-phase AC to DC, such as to support vehicle charging from a domestic wall outlet having 110V, at 60 Hz. The power module 130 includes first and second input 138, 140 and output terminals 142, 144 to establish electrical connections to respective input and output busbars 148, 150, 152, 154. A housing 160 may be configured in a manner similar to that shown in FIG. 3 to support similar operations of the terminals 138, 140, 142, 144 and busbars 148, 150, 152, 154, as well as to support the circuit 134 within a recess 162 or other area in the housing into which silicon or other martial can be poured to isolate the circuit. A PCB 166 may included with control electronics and measurement electronics 168 to control the circuit 134 components and to determine a voltage drop across the shunt 132, and optionally it may include capabilities to calculate temperature and current based on the voltage drop.

Figure 5:
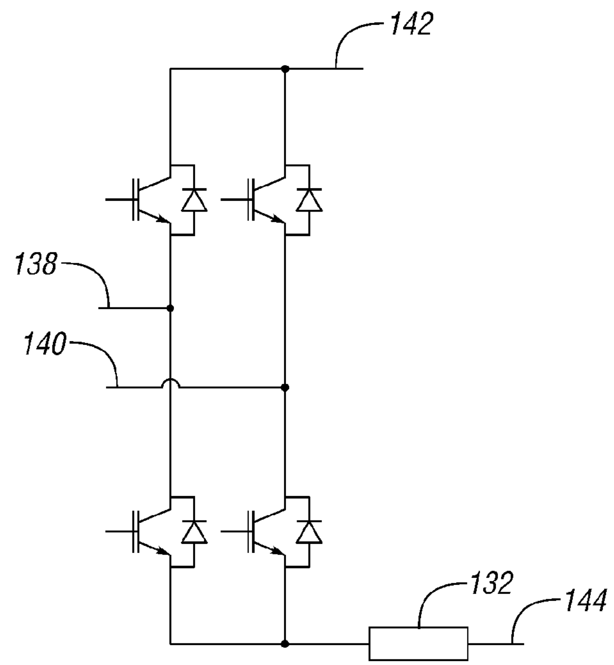
FIG. 5 schematically illustrates a circuit in accordance with one non-limiting aspect of the present invention.

FIG. 5 schematically illustrates the circuit 134 having a plurality of switches arranged to invert single-phase AC to DC, such as to support vehicle charging from a wall outlet. The illustrated circuit 134 includes a plurality of switches (shown as four FETs) and diodes. The shunt 132 may be positioned in any position suitable to measuring current and is shown to be positioned between the second output terminal 144 and one of the plurality of switches. The embedded shunt 132 includes the measurement material without the copper portions shown above. The embedded shunt 132 may be sized and shaped depending on its position within the circuit, and need not necessarily, have a cross-section that matches with the busbars.

Figure 6:
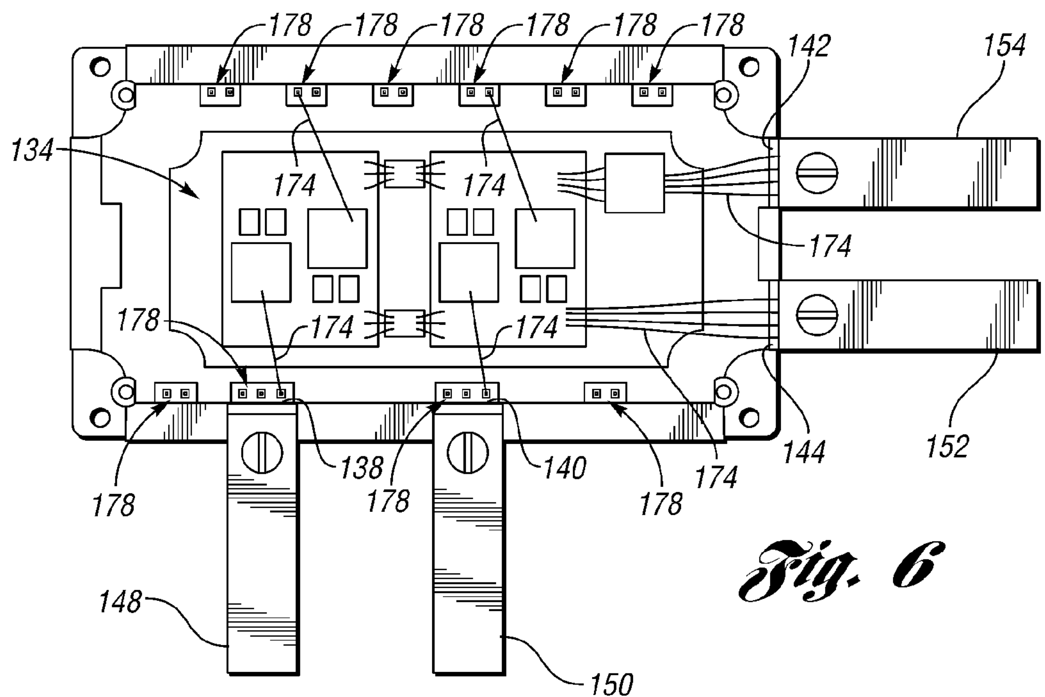
FIG. 6 illustrates a shunt being positioned within a circuit in accordance with one non-limiting aspect of the present invention.

FIG. 6 illustrates the embedded shunt 132 being positioned within the circuit 12 in accordance with one non-limiting aspect of the present invention. The shunt 132 may be mounted to a ceramic or other insulator and covered with a silicon or other potting material 172 poured over the plurality of switches. Wires 174 may be included to electrically connect to the shunt 132 to the one or more of the switches, the switches to one or more pins 178, and the shunt 132 and the switches to one or more terminals 138, 140, 142, 144. The pins 178 may be used to establish electrical connections with the PCB 166, such as to facilitate controlling switch opening and closing and measurement of current though the shunt 132, such as in the manner described above.

Figure 7:
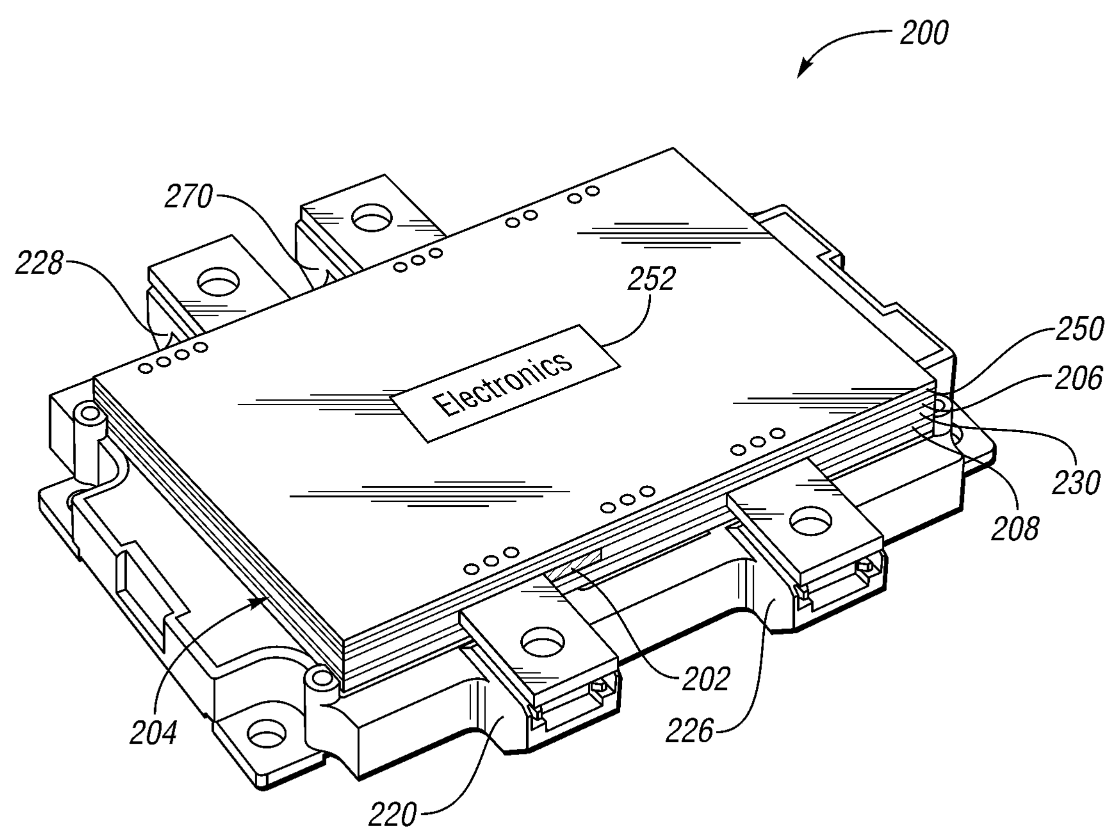
FIGS. 7-8 illustrate a power module having am integrated shunt in accordance with one non-limiting aspect of the present invention.
Figure 8:
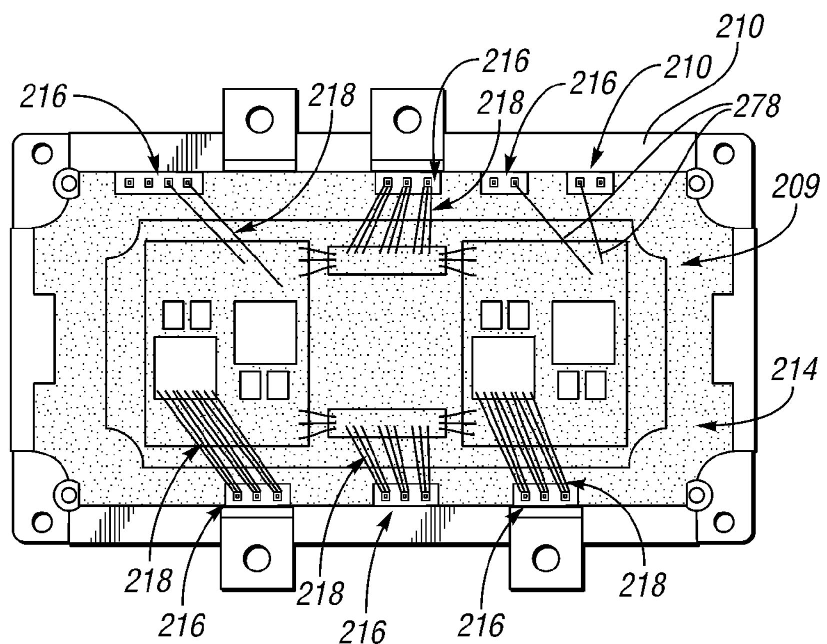
Figure 9:
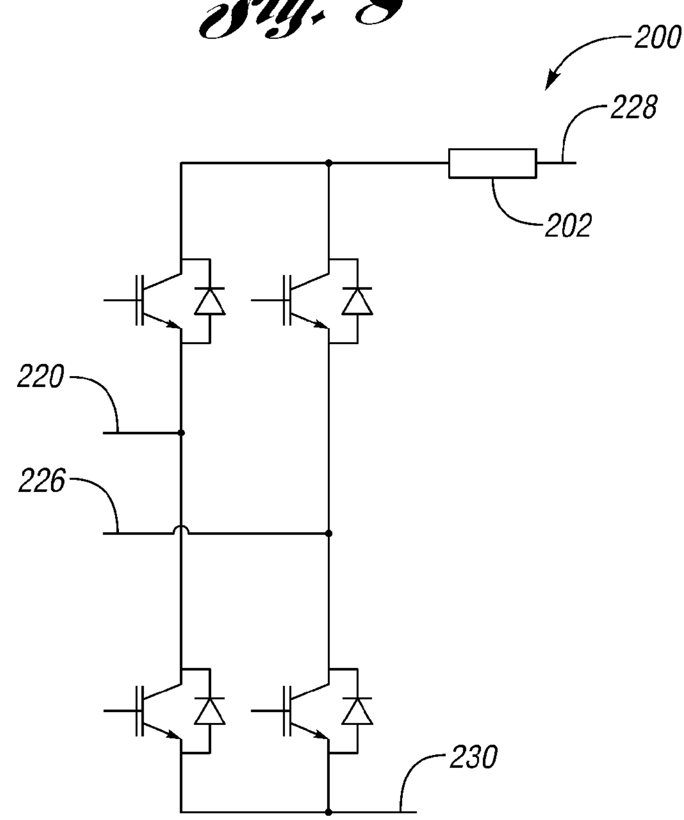
FIG. 9 schematically illustrates a circuit in accordance with one non-limiting aspect of the present invention.

FIG. 7 illustrates a power module 200 having a shunt 202 integrated within a PCB 204 in accordance with one non-limiting aspect of the present invention. The integrated shunt 202 is positioned between non-conducting layers 206, 208 of the PCB. FIG. 8 illustrates the PCB 204 being removed to reveal a circuit 209. FIG. 9 illustrates the circuit 209 for use with the integrated shunt 202 in accordance with one non-limiting aspect of the present invention. The circuit 209 is generally similar to the circuit shown in FIG. 5 at least in so far having a plurality of switches and diodes being disposed within a housing 210 and covered with a silicon material 214. The circuit 209 components may be electrically connected to each other and/or pins 216 included within the housing by a plurality of wires 218.

Figure 10:
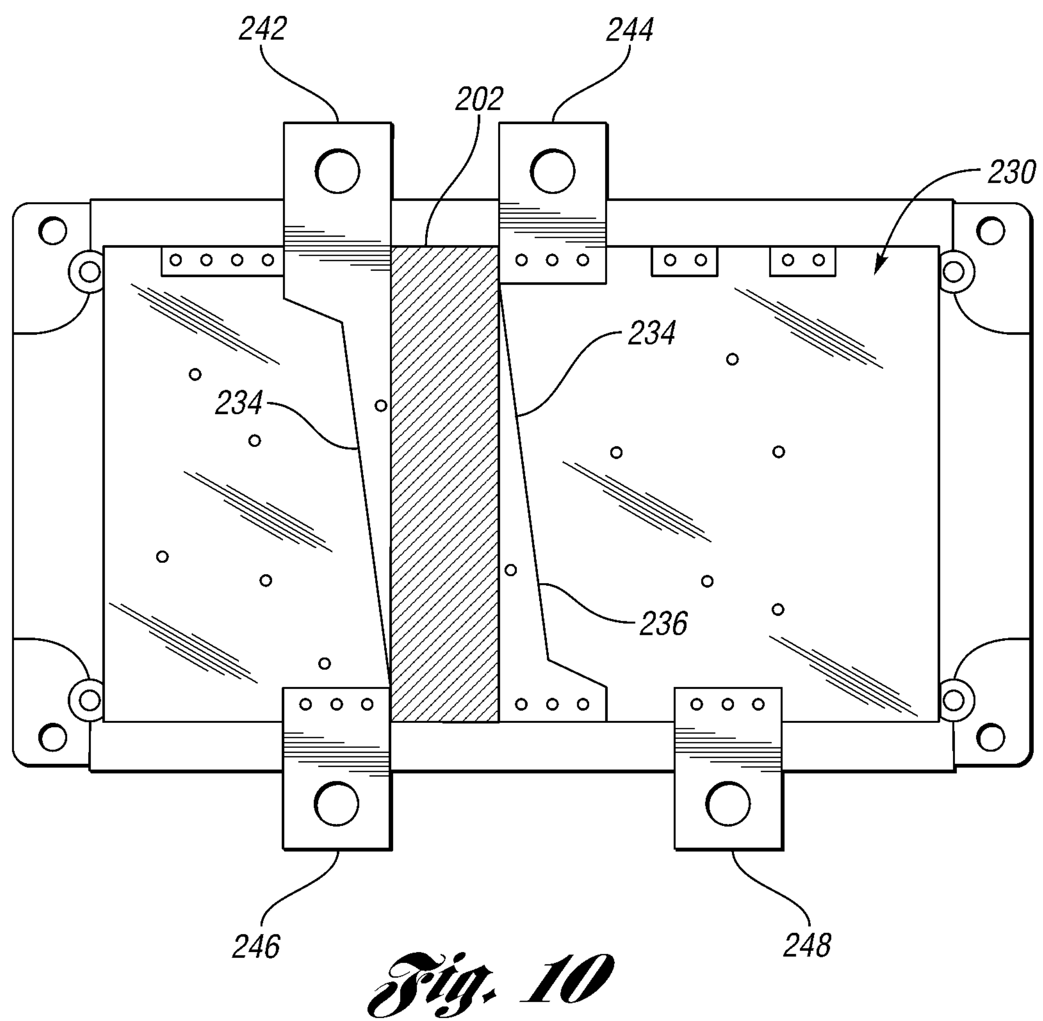
FIG. 10 illustrates a conducting layer of the integrated shunt in accordance with one non-limiting aspect of the present invention.

The module 200 is shown to be configured to support rectifying single-phase AC to DC, such as to support vehicle charging from a domestic wall outlet having 110V, at 60 Hz. The power module 200 includes first and second input 220, 222 and output terminals 224, 226 to establish electrical connections to respective input and output busbars (not shown). FIG. 10 illustrates the conducting layer 230 having the shunt 202 including a first material 234 on opposite sides of the shunt 202, such as but not limited to copper. The shunt 202 may be composed of any suitable measurement material. Isolating boundaries 234, 236, or etchings, may be included to electrically isolate portions of the conducting layer from each other. Vias of the PCB may extend through the conducting layer as needed to facilitate electrical connections to the conducting layer.

Planar portions 242, 244, 246, 248 of the conducting layer 230 may extend outwardly to align with input and output terminals. The planar portions 242, 244, 246, 248 may be defined as extensions having the same cross-sectional width and shapes to rest of the conducting layer 230. Fasteners (not shown) may extend through opening in the planar potions to mechanically and electrically connect to the terminals and corresponding input and output busbars or wires (not shown). The circuit 209 may be positioned below a top layer 250 of the PCB 204 having electronics 252 for controlling the circuit 209 and measuring a voltage drop across the shunt 202.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention. The features of various implementing embodiments may be combined to form further embodiments of the invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A power module operable for use within a vehicle to rectify a three-phase, AC input to a DC output, the power module comprising:

a housing;

a first input terminal, a second input terminal, and a third input terminal, each of the first, second, and third input terminals being disposed within the housing and operable to establish an electrical connection to one of three busbars carrying the AC input;

a first output terminal and a second output terminal, each of the first and second output terminals being disposed within the housing, and operable to establish an electrical connection to any one of two busbars carrying the DC output;

a rectifier disposed within the housing between the input terminals and the output terminals, the rectifier having a plurality of switches operably connected between the input terminals and the output terminals to rectify the three-phase AC input to the DC output;

a shunt electrically disposed between the connection to one of the output terminals and at least one of the switches such that current flow through the one of the output terminals must pass through the shunt;

a first shunt pin and a second shunt pin, each of the first and second shunt pins being adhered to the shunt at spaced apart locations; and a printed circuit board (PCB) having control electronics operable to control opening and closing of each of the switches and measurement electronics operable to measure a voltage drop between the first and second shunt pins.

2. The power module of claim 1 wherein the PCB includes a first electrically conducting aperture and a second electrically conducting aperture being above the first and second shunt pins for establishing an electrical connection between each of the first and the second shunt pins and the measurement electronics.

3. The power module of claim 2 wherein the PCB is mechanically connected to the housing and a substantial portion of the PCB is disposed above the rectifier.

4. The power module of claim 3 wherein the shunt is disposed below the PCB and above the rectifier.

5. The power module of claim 4 wherein a cross-section of the shunt matches a cross-section of each of the busbars.

6. The power module claim 1 wherein the shunt includes a first material and a second material, the first material being disposed on first and second sides of the second material, the first shunt pin being adhered to the first material proximate the first side of the second material and the second shunt pin being adhered to the first material proximate to the second side of the second material.

7. The power module of claim 6 wherein a cross-section of the first material matches a cross-section of the second material and a cross-section of each of the busbars.

8. The power module of claim 1 further comprising a plurality of threaded fasteners establishing the electrical connections between the terminals and the busbars and between the shunt and a terminal electrically connected to the at least one of the switches, each of the terminals including a threaded insert having an aperture shaped to threadably secure to one of the threaded fasteners, the threaded fasteners passing through apertures in the busbars to mechanically and electrically fasten the busbars to the inserts.

9. The power module of claim 1 wherein each shunt pin has an L-shaped configuration characterized by a horizontally extending pad and an upwardly extending leg, the pad being adhered to the shunt and the leg extending through the PCB.

10. The power module of claim 1 wherein each shunt pin is adhered to the shunt with a weld and wherein the shunt and each of the busbars are approximately the same size and shape.

11. The power module of claim 10 wherein at least one of the shunt pins is rigid throughout and wherein the shunt and each of the busbars have the same shape.

12. A power module operable for use within a vehicle to rectify an AC input to a DC output, the power module comprising:

a housing;

a first input terminal and a second input terminal, each of the first and second input terminals being disposed within the housing and operable to establish an electrical connection to the AC input;

a first output terminal and a second output terminal, each of first and second output terminals being disposed within the housing and operable to establish an electrical connection to any one of two busbars carrying the DC output;

a circuit disposed within the housing between the input terminals and the output terminals, the circuit having a plurality of switches operably connected between the input terminals and the output terminals to rectify the AC input to the DC output;

a shunt electrically disposed between the connection to one of the output terminals and one of the switches such that current flow through the one of the output terminals must pass through the shunt; and a printed circuit board (PCB) having control electronics operable to control opening and closing of each of the switches and measurement electronics operable to measure a voltage drop across a portion of the shunt.

13. The power module of claim 12 wherein the shunt is embedded within silicon of the circuit.

14. The power module of claim 12 wherein the shunt is embedded within the PCB.

15. The power module of claim 12 wherein the shunt is comprised solely of a measurement material.

16. The power module of claim 12 wherein the shunt is comprised of a measurement material surround on opposed sides with a copper material and wherein the shunt and each of the busbars are approximately the same size and shape, wherein a length of the shunt and busbar is greater than a width of the circuit.

17. The power module of claim 16 further comprising a first shunt pin adhered to the copper material proximate one side of the measurement material and a second shunt pin adhered to the copper material proximate an opposite side of the measurement material, wherein a leg of each shunt pin extends upwardly through the PCB to establish an electrical connection with the measurement electronics.

18. A power module having an input and an output, the power module comprising:

a non-conducting housing;

at least two conducting input terminals disposed within the housing, each input terminal having an insert operable with a threaded fastener to mechanically and electrically connect to at least one input busbar;

at least two conducting output terminals disposed within the housing, each output terminal having an insert operable with a threaded fastener to mechanically and electrically connect to at least one output busbar;

a circuit disposed within the housing, the circuit electrically connecting between the input terminals and the output terminals to manipulate AC current received at the input busbars to DC current output to the output busbars;

a shunt electrically connected between the circuit and a first one of the output terminals such that DC current to the first one of the output terminals, and thereby DC current to a first one of the output busbars, flows through the shunt;

the circuit having an insert operable with a threaded fastener to mechanically electrically connect to a first end of the shunt, a second end of the shunt having an aperture through which the threaded fastener used to connect the first one of the output busbars to the first one of the output terminals passes in order to mechanically and electrically connect the shunt to the first one of the output terminals and the first one of the output busbars;

a first shunt pin and a second shunt pin, each of the first and second shunt pins being adhered at spaced apart portions of the shunt; and a printed circuit board (PCB) having control electronics operable to control opening and closing of each of the switches, the first and second shunt pins passing through apertures within the PCB to electrically connect to measurement electronics operable to measure a voltage drop between the first and second shunt pins.

19. The power module of claim 18 wherein each shunt pin has an L-shaped configuration with a horizontally extending pad and an upwardly extending leg, the pad being adhered to the shunt and the leg extending through the PCB.

20. the power module claim 18 wherein the shunt and each of the input and output busbars have approximately the same size and shape.

* * * * *

UNITED STATES PATENT AND TRADEMARK OFFICE

CERTIFICATE OF CORRECTION

PATENT NO. : 8,482,904 B2
APPLICATION NO. : 12/786607
DATED : July 9, 2013
INVENTOR(S) : Yann Darroman et al.

It is certified that error appears in the above-identified patent and that said Letters Patent is hereby corrected as shown below:

In the Claims

Column 6, Line 3, Claim 6:

After “The power module” insert -- of --.

Signed and Sealed this
Fourth Day of March, 2014

Michelle K. Lee

Michelle K. Lee
*Deputy Director of the United States Patent and Trademark Office*